(12) United States Patent
Gustafsson et al.

(10) Patent No.: US 6,979,643 B2
(45) Date of Patent: Dec. 27, 2005

(54) INTERLAYER CONNECTIONS FOR LAYERED ELECTRONIC DEVICES

(75) Inventors: Goran Gustafsson, Linkoping (SE); Peter Dyreklev, Linkoping (SE); Johan Carlsson, Linkoping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/720,680

(22) Filed: Nov. 25, 2003

(65) Prior Publication Data

US 2004/0137712 A1   Jul. 15, 2004

(30) Foreign Application Priority Data

Nov. 29, 2002   (NO) ..................................... 025772

(51) Int. Cl.[7] ................... H01L 21/44; H01L 29/40
(52) U.S. Cl. .................. 438/666; 438/622; 438/624; 438/668; 438/637; 438/667; 257/773; 257/775; 257/765; 257/750; 257/758; 257/760
(58) Field of Search ....................... 438/666, 622, 438/624, 668, 637, 667; 257/773, 775, 765, 257/750, 758, 760

(56) References Cited

U.S. PATENT DOCUMENTS

| | | | |
|---|---|---|---|
| 5,322,816 A * | 6/1994 | Pinter | 438/667 |
| 6,127,070 A | 10/2000 | Yang et al. | |
| 6,200,855 B1 * | 3/2001 | Lee | 438/255 |
| 6,307,267 B1 * | 10/2001 | Wada et al. | 257/761 |
| 6,342,416 B1 * | 1/2002 | Kim et al. | 438/239 |
| 6,373,136 B2 * | 4/2002 | Otsuka et al. | 257/758 |
| 6,417,572 B1 * | 7/2002 | Chidambarrao et al. | 257/773 |
| 6,501,113 B2 * | 12/2002 | Tsunemine et al. | 257/295 |
| 6,555,450 B2 * | 4/2003 | Park et al. | 438/533 |
| 6,600,225 B2 * | 7/2003 | Tanaka | 257/750 |

FOREIGN PATENT DOCUMENTS

JP            05160445 A  *  6/1993  ........... H01L 39/06

\* cited by examiner

*Primary Examiner*—B. William Baumeister
*Assistant Examiner*—Igwe U. Anya
(74) *Attorney, Agent, or Firm*—Jacobson Holman PLLC

(57) ABSTRACT

In a method for forming interlayer connections, metal conducting paths in an overlaying layer and vias forming the deposit in one and the same operation. In an interlayer connection formed in this manner the vias are provided integral with connecting conducting paths in the overlaying layer.

10 Claims, 3 Drawing Sheets

INTERLAYER CONNECTIONS FOR LAYERED ELECTRONIC DEVICES

Figure 1:
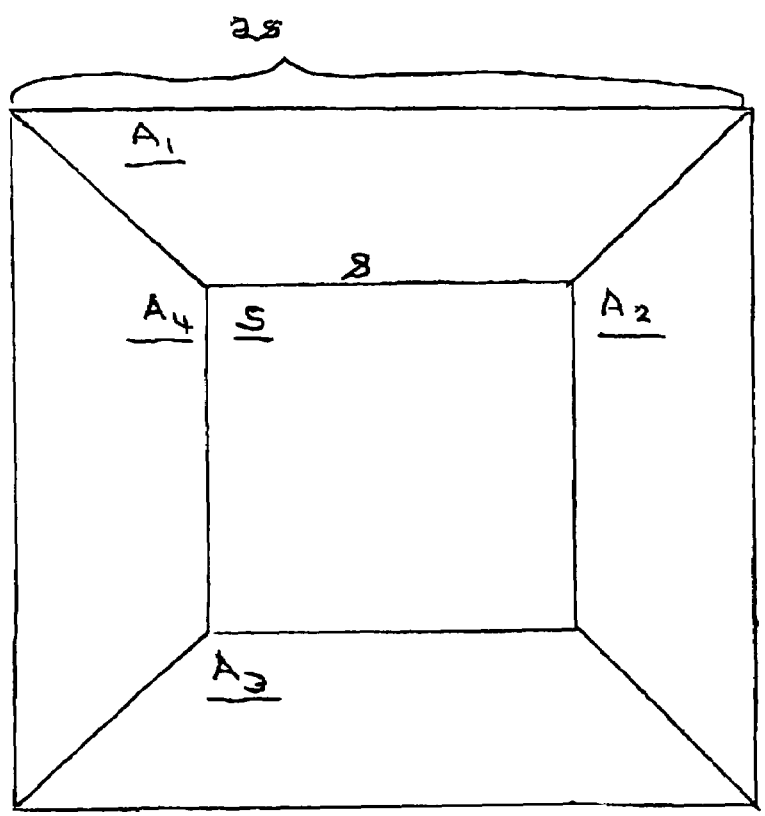

The present invention concerns interlayer connections in a layered electronic device, particularly a thin-film device for storing or processing of data, wherein the device comprises electrical connections between circuitry located in two or more circuit layers separated by layers of electrically insulating material, wherein conducting material is applied as current paths on each circuit layer for connecting the circuitry located therein and joined with interlayer connections consisting of plugs or wires of highly electrically conducting material penetrating said interlayers of electrically insulating material, wherein the plugs or wires in the plane of said interlayers have a cross section with dimensions that are longer in one direction, with longitudinal dimension of representative magnitude Y and transversal dimension of representative magnitude X, such that Y>X In multilayered electronic devices where each layer comprises a large number of conductive parts or electrodes that shall be connected to a peripheral circuitry, e.g. in an underlying substrate, interlayer connections are formed by metallic vias. This will be the case of a thin-film matrix-addressable memory, wherein e.g. a ferroelectric polymer is the memory material. It is desired that the vias shall have a minimal feature size, but at the same time also high-quality field and step coverage is required of the metallic via. The use of high aspect ratio vias based on tungsten plugs has been attempted, but that requires a high-temperature process which is not compatible with the melting temperatures of e.g. polymeric materials and hence it will be unsuited in the cases where the layer surrounding or adjacent to the vias comprises such materials. An alternative has been to provide fan-out conducting paths outside the device proper such that the area for each via is increased and the aspect ratio kept low. It is then possible to form low-ohmic vias without resorting to any metal plugs and there will only be metal-to-metal contact. This kind of prior art is shown in FIG. 1, wherein a circuit die S (substantially shown as square) with side length s has been provided with fan-out vias located in adjacent via areas $A_1$, $A_2$, $A_3$, $A_4$ and an edge length a·s where a is the increased via edge length and s the nominal edge length of an electrode matrix. The problem with this solution is that the use of fan-out conducting paths to establish vias has a very high real-estate cost, as the total area A occupied by the fan-out conducting paths is $a^2 \cdot s^2 - s^2 = s^2(a^2-1)$. In other words, i.e. the sum $A=A_1$, $A_2$, $A_3$, $A_4$ scales as $a^2$. FIG. 1 illustrates an example where the via edge length vs is doubled, i.e. a=2. The area occupied by the fan-out vias then becomes $4 s^2 - s^2 = 3s^2$, i.e. three times larger than the original circuit die or matrix size.

From U.S. Pat. No. 6,127,070 (Yang & al.) there is known a method for forming vias through a dielectric layer by means of etching. Typically vias with geometrically different cross sections can be formed, including rectangular vias with an aspect ratio greater than 4:1. The transverse dimension of such vias as limited by an applicable design rule is in the order of 0.2 μm, implying rectangular vias with a length about 1 μm. Different conductive materials can be used for filling the via hole. Typically tungsten is used as via material, and the via is then referred to as a tungsten plug. In practice, however, a via plug may be formed by any suitable conductive material which is chemically vapour-deposited with sufficient flow rate to fill the via holes.

U.S. Pat. No. 5,322,816 (Pinter) discloses a method for making via holes in e.g. semiconductor layer with a thickness of approximately 1 μm and wherein the transverse side edges of the vias can be formed with a slope or taper in the vertical direction. Via metal is blanket deposited, for instance as a sputtered film, to cover essentially the sloping side edges of the via and a bottom metallic contact.

The above-mentioned prior art methods for forming metallic vias by comporting a number of disadvantages, particularly with regard to thin-film devices where some of the layers comprises thin-film materials of e.g. polymer. They may be extremely thin, e.g. down to some tens of nanometers, and it is thus difficult to tune the process parameters, particularly in the thermal regime, when metal for the via plugs is deposited. Also the number of process steps entails an increased production costs.

Hence it is a primary object of the present invention to form metallic vias in very thin layers in as few process steps as possible and without any detrimental effects on the interlayer, whether it is organic or inorganic, keeping the consumption of via material as low as possible and ensure a very good contact between the conducting paths connected by the vias as well as improved step coverage over at least two side walls perpendicular to the conductor entering the via.

Finally it is also an object of the present invention to avoid the complexity of the interconnect layout and reduce the die size of the interconnect area as compared with the fan-out solutions of prior art as mentioned above.

These objects as well as further features and advantages are achieved according to the invention with a method that is characterized by forming a plug or wire in one and the same step as used for applying the conducting material for a conducting path on an overlying circuit layer.

In the method according to the invention it is considered advantageous providing said plug or wire for connecting current paths in the form of at least one narrow stripe electrode in one or more circuit layers, and in case of more than one, providing all stripe electrodes oriented in parallel, and by orienting said plug or wire such that its longitudinal dimension becomes parallel to the longitudinal direction of said at least one stripe electrode, and then preferably forming said plug or wire completely contained within a footprint of said at least one stripe electrode.

Preferably said plug or wires formed with the ratio between the longitudinal and transversal dimensions Y resp. X such that $Y/X \geq 2.5$. Preferably said plug or wire is formed with the end sides along the short dimension tapering outwards towards the overlying circuit layer.

The above objects as well as further features and advantages are also achieved according to the invention with an interlayer connection according to the invention which is characterized in that the plug or wire is provided integral with the conducting material of a conducting path on an overlying circuit layer.

In the interlayer connection according to the invention it is considered advantageous that current paths are provided in a layer as narrow parallel stripe electrodes, and that the cross section of the plug or wire is provided with its long dimension parallel to the longitudinal direction of the connected stripe electrode on the overlying circuit layer, and then preferably said plug or wire is completely contained within a footprint of at least one stripe electrode.

Preferably said plug or wire have a ratio between the long and short dimension Y resp. X such that $Y/X \geq 2.5$. Preferably said plug or wire is provided with the end sides along the short dimension tapering outward towards the overlying circuit layer.

Figure 2:
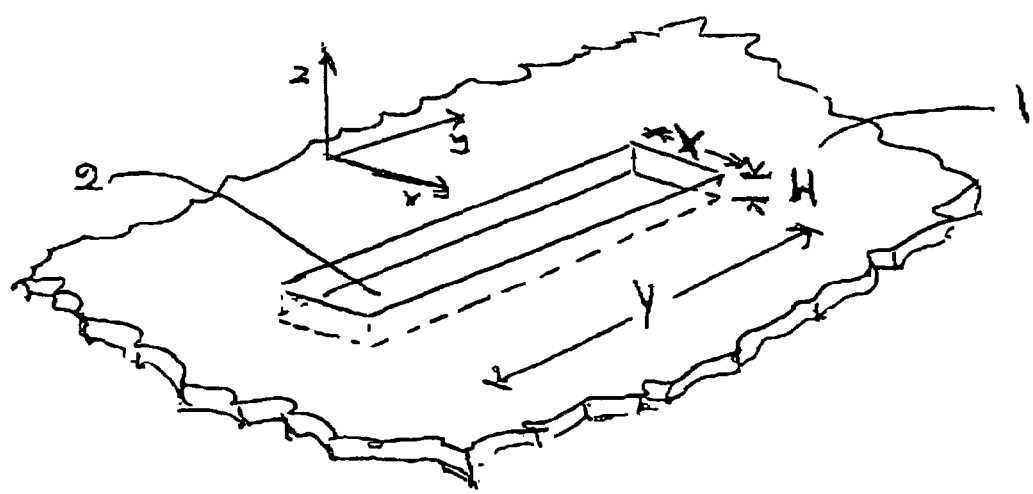
Figure 3:
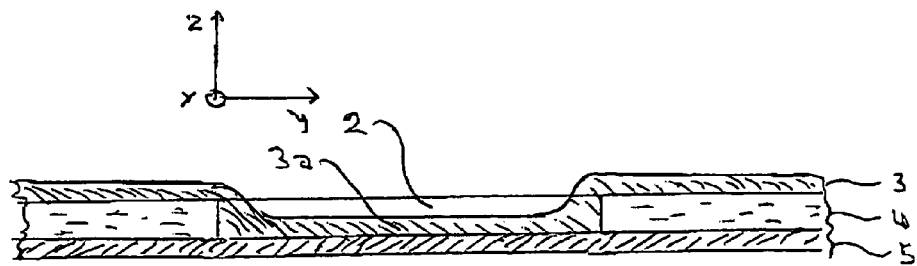
Figure 4:
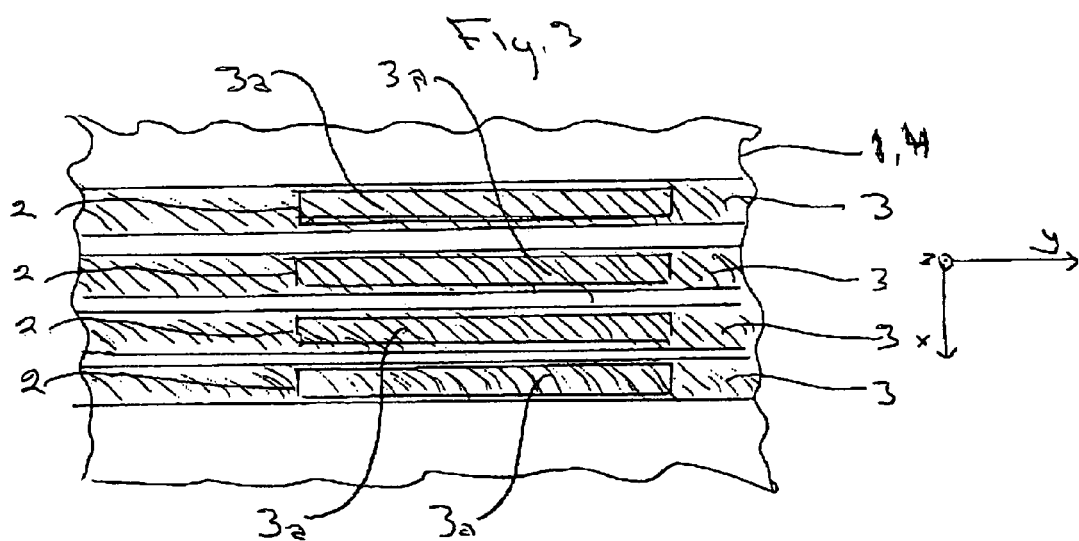
Figure 5:
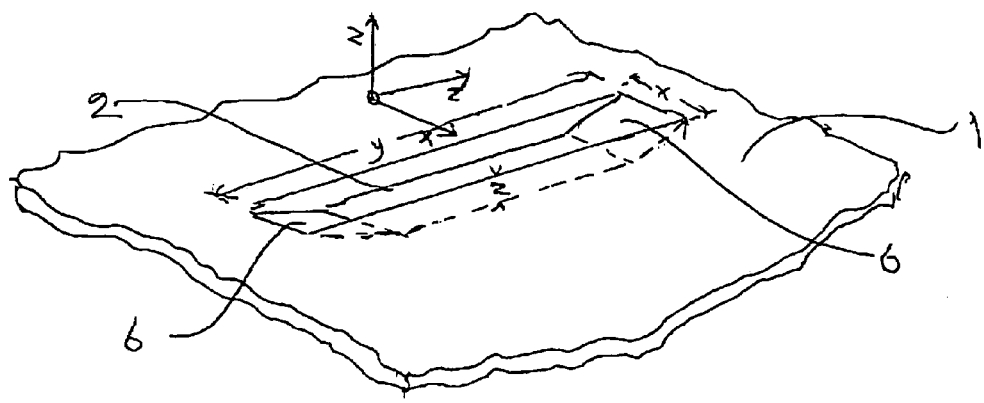
Figure 6:
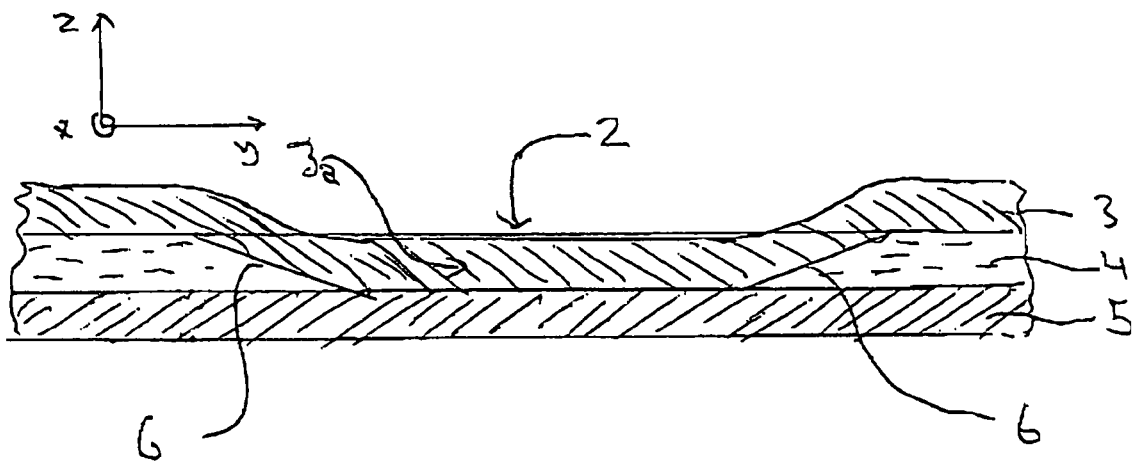

The present invention shall be better understood from the following discussion of preferred embodiments read in conjunction with the drawing figures, of which FIG. 1 shows how fan-out is used for increasing the size of vias as known in the art and mentioned above, FIG. 2 shows a perspective view of a rectangular via opening in an insulating interlayer, FIG. 3 a cross section of an interlayer connection according to the present invention taken along the y axis in FIG. 2, FIG. 4 a plan view of the arrangement of parallel stripe electrodes and interlayer connections in the form of vias in a substrate or interlayer, FIG. 5 a perspective view of another variant of the via opening used for the interlayer connection according to the present invention, and FIG. 6 a cross section taken along the y axis in FIG. 5 of an interlayer connection formed with the via opening in FIG. 5.

Now follows a discussion of preferred embodiments of the present invention.

FIG. 2 shows for instance a layer of insulating material 1, which particularly could be a thin film of polymer, wherein via opening 2 has been formed by any suitable process, for instance conventional photomicrolithography and accompanying etching of the via opening pattern. The via opening 2 is an elongated structure of length Y, width X and height H corresponding to the thickness of interlayer 1 and directions indicated by the coordinate axis x, y, z as depicted.

FIG. 3 shows a first preferred embodiment of an interlayer connection according to the present invention. An interlayer 4 corresponding to layer 1 in FIG. 2, has on either side thereof been provided with electrodes 3;5 which shall be connected through the via opening 2, and this is simply done by depositing the overlaying electrode 3 and the via metal 3a in one and the same operation such that the via metal 3a forming a plug or wire connection actually becomes an integral part of the electrode metal, filling the bottom of the elongated or rectangular via opening 2 and hence ensuring a very good electrical contact between the overlying electrode 3 and the underlying electrode 5. The various structural components in FIG. 3 are essentially depicted as thin films, i.e. the thickness dimensions of both the electrodes 3, as well as the interlayer can all lie in the same range and be regarded as very thin films, particularly when it is considered that the thickness of the interlayer 4 can be in the sub-0.1 $\mu$m range.

A plan view of an electrode and interlayer connection arrangement corresponding to that in FIG. 3 is shown in FIG. 4. Herein parallel stripe electrodes 3 are laid down on a substrate 1 corresponding to interlayer 4 in FIG. 3, and via openings 2 corresponding to the one in FIG. 3 have been preformed in e.g a conventional photomicrolithographic process. An electrode metal in the substrate 1 can now simply be formed as a thin film over the substrate 1, for instance by chemical vapour deposition and deposited at a blanket, covering an underlying electrode 5 through the via opening 2 and ensuring the very good contact between this electrode, which is not shown in FIG. 4a, and the overlying electrodes 3. The latter are simply formed as parallel stripe electrodes as shown by a suitable patterning process, for instance again by resorting to photomicrolithography. It is now ensured that the rectangular via openings are completely contained within the footprint of the stripe electrodes 2 so that the via metal which of course is the same as that of the conducting path 3, maintains its integrity in the patterning process. Particularly it should be noted that the via metal 3a in this case will not be affected by the latter and not subjected to an applied etchant.

Another preferred embodiment of a via interlayer connection according to the present invention shall now be discussed with reference to FIGS. 5 and 6. FIG. 5 shows again a via opening 2 formed in a layer 1, but such that the end surfaces 6 of the via opening are sloping or tapering from the top of the layer 1 toward its bottom. Such tapered via end surfaces 6 can easily be formed in the patterning process by resorting to some suitable preferential etch-process or a controlled chemical milling, as will be obvious to persons skilled in the art. The tapered end surfaces 6 of the via hole 2 shall now to serve to ensure a much better coverage of the step formed by the via opening 2 in the interlayer 4, corresponding to layer 1 in FIG. 5 as shown to advantage in cross section taken along the y axis in FIG. 6. While the perpendicular step of the via opening 2 shown in FIG. 3 may result in an improper covering of the underlying electrode 5 in the end portions of the via opening or even microfissures in the via metal 3a, the tapered or sloped end surfaces 6 as shown in FIG. 6 ensures that a high-quality step coverage shall be ensured with a fairly low slope angle. On the other hand the slope angle should not be too low to ensure that the contact area between the via metal 3a and the underlying electrode 5 is as large as possible. The metal for the electrodes 3 and the via 3a is of course also one and the same and laid down in one and the same deposition and patterning operation.

As apparent from the above discussion it will be seen that the present invention provides a method for forming interlayer connections wherein the via metal and overlying electrodes to be connected through the via opening with an underlying electrode. Both the via metal and the overlying electrode are formed of the same material and provided in one and the same deposition and patterning process. Apart from reducing the number of process step involved in making the via metal plug according to the method of the an invention, the interlayer connection according to the invention has excellent contact properties and is particularly well-adapted for use the thin-film devices wherein the interlayers may be either inorganic or organic thin films and the thickness of the electrode layers of comparable to the thickness of the interlayers.

More particularly the method and interlayer connection according to the present invention are eminently suited for matrix-addressable devices wherein each electrode layer comprises a huge number of parallel stripe electrodes that shall be connected downwards through an interlayer at the edge of the matrix die. Further the present invention in addition to providing high-quality interlayer connections reduces both fabrication and real estate costs.

What is claimed is:

1. A method for forming interlayer connections in a layered thin-film electronic device for storing or processing of data, wherein the device comprises electrical connections between circuitry located in two or more circuit layers separated by layers of electrically insulating material, wherein conducting material is applied as current paths on each circuit layer for connecting the circuitry located therein and joined with interlayer connections consisting of plugs or wires of highly electrically conducting material penetrating said interlayers of electrically insulating material, wherein the plugs or wires in the plane of said interlayers have a cross section with dimensions that are longer in one direction, with a longitudinal dimension of representative magnitude Y and a transversal dimension of representative magnitude X, such that Y>X, and the method comprising the steps of forming an underlying circuit layer, placing an insulating interlayer overlying the underlying circuit layer and the insulating interlayer having a via opening having the longitudinal dimension and the transversal dimension such that Y>X, and forming an overlying circuit layer overlying the insulating interlayer while simultaneously entirely forming a plug or wire as a part of the overlying circuit layer to pass into the via opening and the plug or wire being the only contact between the underlying circuit layer and the overlying circuit layer and the plug or wire being formed in one and the same step as used for applying the conducting material for a conducting path of the overlying circuit layer.

2. The method according to claim 1, wherein said plug or wire is provided for connecting current paths in the form of at least one narrow stripe electrode in one or more circuit layers, and in case of more than one, providing all stripe electrodes oriented in parallel, and by orienting said plug or wire such that its longitudinal dimension becomes parallel to the longitudinal direction of said at least one stripe electrode.

3. The method according to claim 2, wherein said plug or wire is formed completely contained within a footprint of said at least one stripe electrode.

4. The method according to claim 1, wherein said plug or wire is formed with a ratio between the longitudinal and transversal dimensions, Y and X, respectively, such that Y/X>2.5.

5. The method according to claim 1, wherein said plug or wire is formed with the end sides along the short dimension tapering outwards towards the overlying circuit layer.

6. An interlayer connection in a layered thin-film electronic device for storing or processing of data, wherein the device comprises electrical connections between circuitry located in two or more circuit layers separated by layers of electrically insulating material, wherein conducting material is applied as current paths on each circuit layer for connecting the circuitry located therein and joined with interlayer connections consisting of plugs or wires of highly electrically conducting material penetrating said interlayers of electrically insulating material, wherein the plugs or wires in the plane of said interlayers have a cross section with dimensions that are longer in one direction, with a longitudinal dimension of representative magnitude Y and a transversal dimension of representative magnitude X, such that Y>X, said interlayer connection comprising an underlying circuit layer, an insulating interlayer overlying the underlying circuit layer and the insulating interlayer having a via opening having the longitudinal dimension and the transversal dimension such that Y>X, and an overlying circuit layer overlying the insulating interlayer while being entirely formed to include the plug or wire integral with the conducting material of a conducting path on the overlying circuit layer and extending into the via opening so that the plug or wire is the only contact between the underlying circuit layer and the overlying circuit layer.

7. The interlayer connection according to claim 6, wherein current paths are provided in a layer as narrow parallel stripe electrodes, and the cross section of the plug or wire is provided with its long dimension parallel to the longitudinal direction of the connected stripe electrode on the overlying circuit layer.

8. The interlayer connection according to claim 7, wherein said plug or wire is completely contained within a footprint of at least one stripe electrode.

9. The interlayer connection according to claim 6, wherein said plug or wire have a ratio between the long and short dimension Y and X, respectively, such that Y/X>2.5.

10. The interlayer connection according to claim 6, wherein said plug and wire are provided with the end sides along the short dimension tapering outward towards the overlying circuit layer.

* * * * *